US006824653B2

(12) United States Patent
Oshmyansky et al.

(10) Patent No.: US 6,824,653 B2
(45) Date of Patent: Nov. 30, 2004

(54) MAGNETRON WITH CONTROLLED DC POWER

(75) Inventors: Yury Oshmyansky, Camarillo, CA (US); Sergey Mishin, Goleta, CA (US); Richard C. Ruby, Menlo Park, CA (US); John D. Larson, III, Palo Alto, CA (US)

(73) Assignee: Agilent Technologies, Inc, Palo Alto, CA (US)

( * ) Notice: Subject to any disclaimer, the term of this patent is extended or adjusted under 35 U.S.C. 154(b) by 15 days.

(21) Appl. No.: 10/371,463

(22) Filed: Feb. 21, 2003

(65) Prior Publication Data

US 2004/0163944 A1 Aug. 26, 2004

(51) Int. Cl.[7] .............................................. C23C 14/34
(52) U.S. Cl. ........................ 204/192.12; 204/298.12; 204/298.16; 204/298.17; 204/298.06; 204/298.08
(58) Field of Search ..................... 204/192.12, 298.12, 204/298.13, 298.16, 298.17, 298.06, 298.08

(56) References Cited

U.S. PATENT DOCUMENTS

| | | | | | |
|---|---|---|---|---|---|
| 4,595,482 A | * | 6/1986 | Mintz | .................... | 204/298.03 |
| 5,507,930 A | * | 4/1996 | Yamashita et al. | ..... | 204/192.15 |
| 5,897,753 A | * | 4/1999 | Schatz et al. | .......... | 204/192.12 |

* cited by examiner

Primary Examiner—Steven VerSteeg

(57) ABSTRACT

A magnetron with mechanisms for smoothly and continuously adjusting a DC power applied to its targets to compensate for the changes in the sputtering characteristics of the targets that occur with target aging. A magnetron according to the present teachings includes a set of concentric targets for sputtering a film onto a wafer in response to an AC power and a DC power applied to the targets and a power controller that adjusts the DC power. The adjustments to the DC power enable the magnetron to maintain uniformity in the thicknesses of films formed with the magnetron throughout the life of its targets.

13 Claims, 3 Drawing Sheets

MAGNETRON WITH CONTROLLED DC POWER

BACKGROUND OF THE INVENTION

1. Field of Invention

The present invention pertains to the field of magnetrons. More particularly, this invention relates controlling target power in a magnetron.

2. Art Background

A magnetron is a device that is commonly used for depositing a film onto a surface. The process of depositing a film onto a surface using a magnetron is commonly referred to as sputtering. For example, a magnetron may be used to sputter an aluminum-nitride film onto a silicon wafer. An aluminum-nitride film on a silicon wafer may be a step in the manufacture of piezoelectric acoustic resonator filters including film bulk acoustic resonator (FBAR) filters.

A typical magnetron includes a chamber and one or more targets that are bombarded with ions. The ion bombardment of the targets usually causes erosion of the target material. Typically, eroded material from the targets is deposited as a film onto a wafer contained in the chamber. The target material is usually selected to yield a particular substance to be deposited on the wafer. To deposit an aluminum-nitride film onto a silicon wafer, for example, the target material is typically aluminum.

The sputtering characteristics of the targets in a magnetron typically change throughout the life of the targets. For example, the cumulative effect of material erosion from a target gradually changes the shape of the surface of the target throughout its life. A change in the shape of a target surface usually changes the angle at which material is eroded from the target. A change in the angle of material erosion from a target usually changes the rate of material deposition from that target onto a wafer. In addition, the changes to rates of material deposition usually varies among the targets in a magnetron.

Such variation in the sputtering characteristics among targets in a magnetron usually degrades the uniformity in thicknesses of films deposited on wafers as the targets age. Unfortunately, such non uniformity in film thickness usually creates undesirable film characteristics. In an FBAR filter, for example, the lower the uniformity in the aluminum-nitride film thickness the lower the yield of the resulting filters.

SUMMARY OF THE INVENTION

A magnetron is disclosed with mechanisms for smoothly and continuously adjusting a DC power applied to its targets to compensate for the changes in the sputtering characteristics of the targets that occur with target aging. A magnetron according to the present teachings includes a set of concentric targets for sputtering a film onto a wafer in response to an AC power and a DC power applied to the targets and a power controller that adjusts the DC power. The adjustments to the DC power enable the magnetron to maintain uniformity in the thicknesses of films formed with the magnetron throughout the life of its targets.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
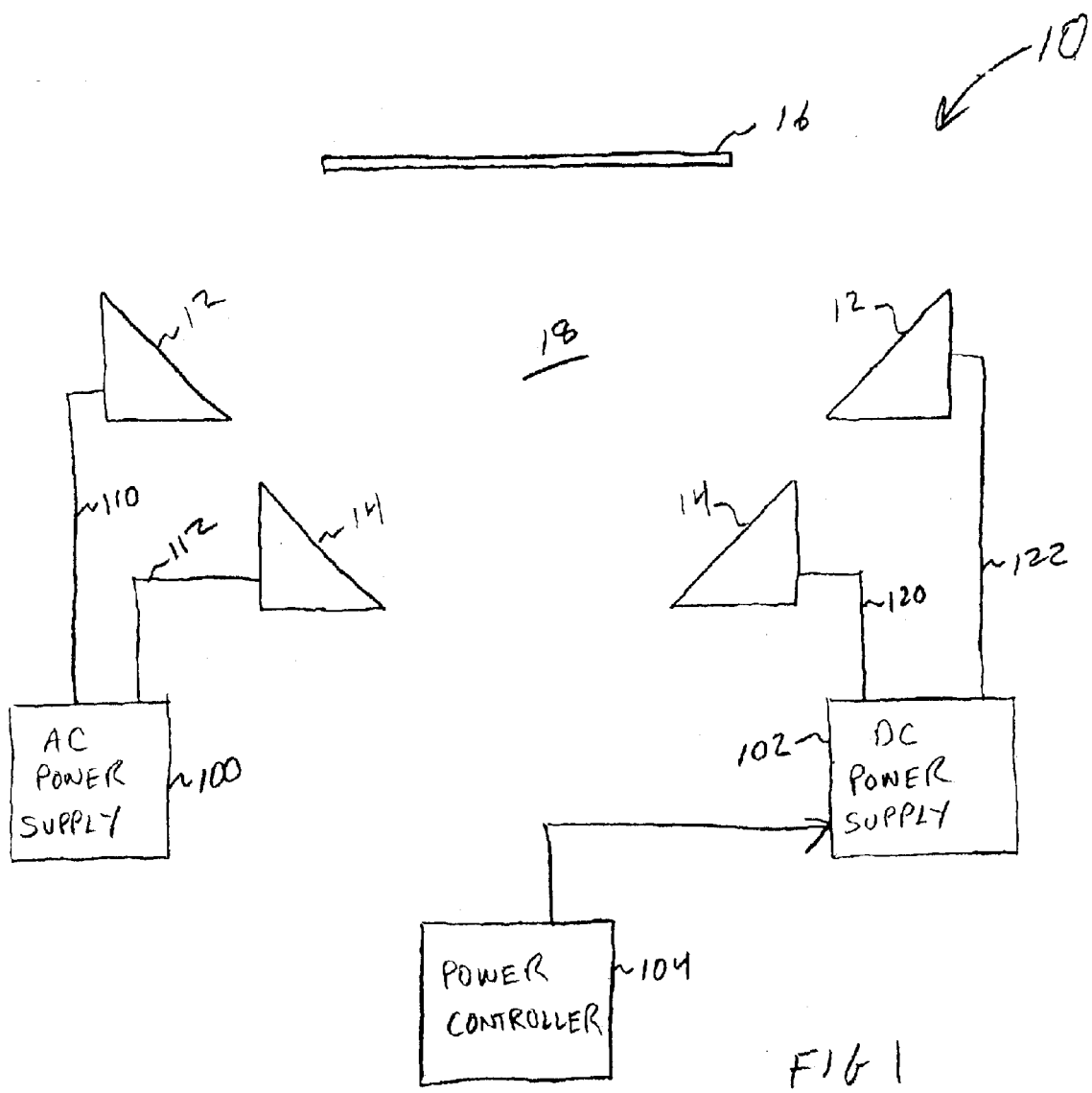
FIG. 1 shows the power control mechanisms in a magnetron according to the present teachings.

FIG. 1 shows the power control mechanisms in a magnetron 10 according to the present teachings. The magnetron 10 includes a pair of targets 12 and 14 for sputtering material onto a wafer 16 contained in a chamber 18 of the magnetron 10. The targets 12 and 14 have a conical shape and are concentric.

The magnetron 10 includes an AC power supply 100 that applies AC power to the targets 12 and 14 via a set of power lines 110 and 112. The AC power applied to the targets 12 and 14 ignites a plasma in the chamber 18 and interaction of electrons and the gas contained in the chamber 18 creates ions that under influence of the electrical potentials applied to the targets 12 and 14 accelerate toward and hit the targets 12 and 14, thereby causing erosion of material from the targets 12 and 14 and the deposition of eroded material onto the wafer 16.

In one embodiment, the electrical potentials applied to the targets 12 and 14 are reversed in polarity at a frequency of 40 Kilohertz. The periodic reversal of the electrical potentials causes ions to alternate between striking the targets 12 and 14 so that erosion occurs from both targets 12 and 14 in an alternating fashion.

The magnetron 10 further includes a DC power supply 102 and a power controller 104. The DC power supply 102 applies DC power to the targets 12 and 14 via a set of power lines 120 and 122. The DC power supply 102 applies a positive polarity to the target 12 and a negative polarity to the target 14. The power controller 104 controls the magnitude of the DC power that the DC power supply 102 applies to the targets 12 and 14. The magnetron 10 uses the AC power supply 100 to run the basic sputtering system and the DC power supply 102 for adjustment of the uniformity of the film deposited onto the wafer 16 throughout the life of the targets 12 and 14.

Figure 2A:
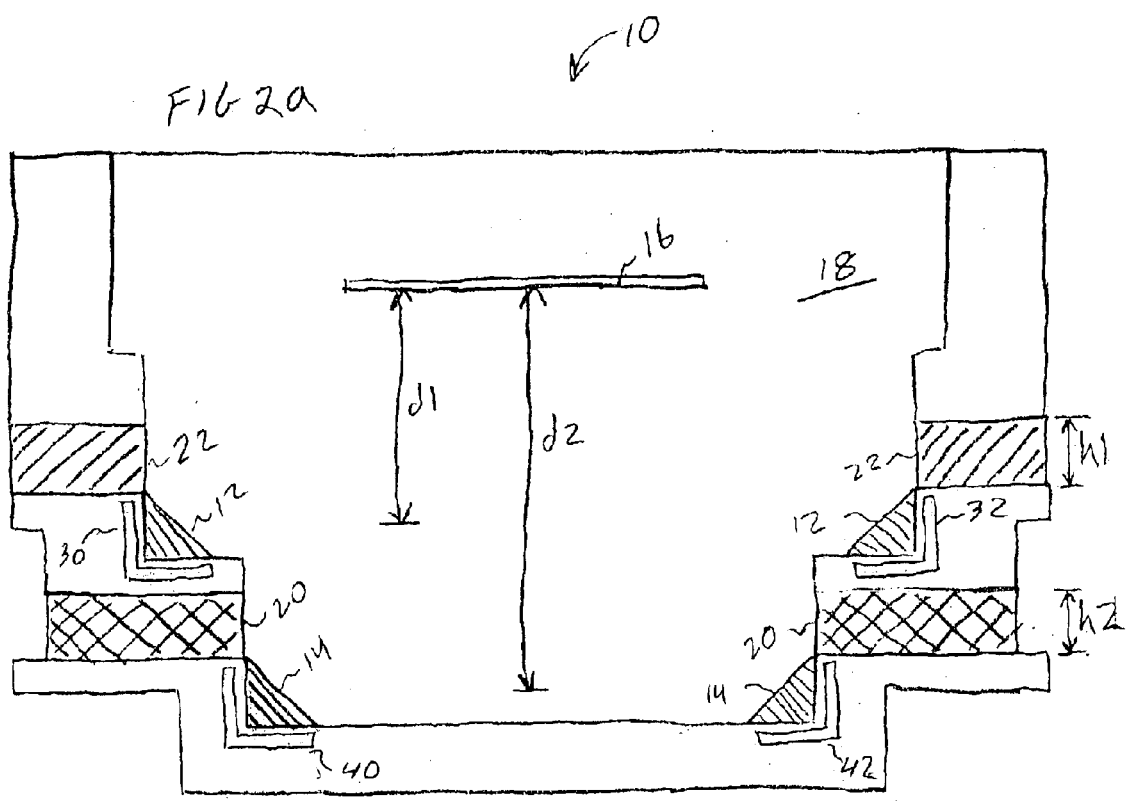
FIGS. 2a–b show cross sectional views of a magnetron in one embodiment.
Figure 2B:
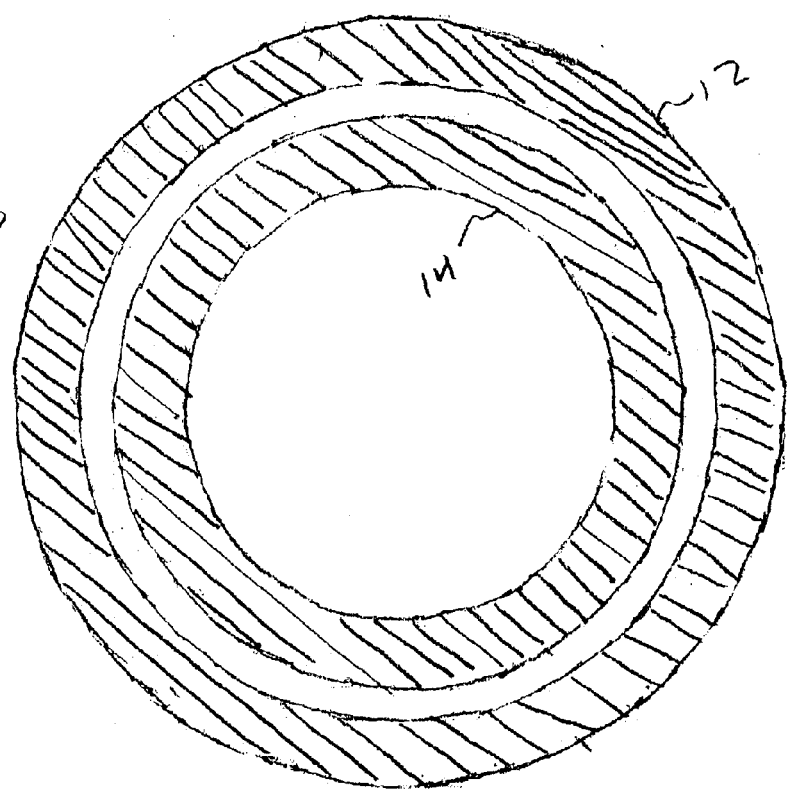

FIG. 2a shows a cross sectional side view of the magnetron 10 in one embodiment. The target 12 may be referred to as the upper target and the target 14 may be referred to as the lower target. FIG. 2b shows a top view of the concentric targets 12 and 14.

The plane of the upper target 12 is positioned a distance d1 from the plane of the wafer 16 and the plane of the lower target 14 is positioned a distance d2 from the plane of the wafer 16. The magnetron 10 includes a set of magnetic structures 30 and 32, 40 and 42 for generating magnetic fields that act on the targets 12–14. The magnetic structures 30–32, 40–42 are located behind the horizontal and vertical edges of the targets 12 and 14. In one embodiment, the magnetic structures 30–32, 40–42 are contained in a copper assembly of radial pockets (from a top view of the magnetron 10) for holding magnets and pole pieces. The chamber 18 contains a gas. The chemical make up of the gas in the chamber 18 together with the material from which the targets 12 and 14 are made are pre-selected for deposition of a desired substance onto the wafer 16.

In one embodiment, magnetron 10 is used for sputtering thin films of highly piezoelectric aluminum nitride. The chamber 18 contains nitrogen and argon gas and the targets 12 and 14 are made of aluminum. The wafer 16 may be a silicon wafer.

Figure 3:
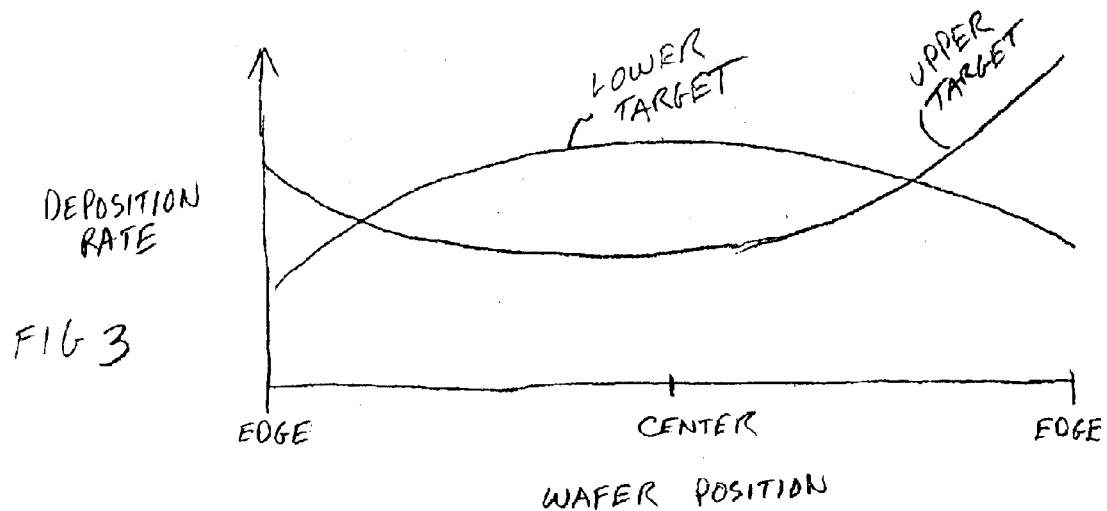
FIG. 3 shows example sputtering characteristics for an upper target and a lower target at the start of their life.

FIG. 3 shows example sputtering characteristics for the upper target 12 and the lower target 14 at the start of their life. The profiles shown represents the rate of material deposition onto the wafer 16 from the specified target as a function of wafer position from one extreme outer edge of the wafer 16 to the center of the wafer 16 to the other extreme outer edge of the wafer 16.

The profile for the upper target 12 shows a greater rate of deposition from the upper target 12 near the edge of the wafer 16. This is a characteristic of the angles of erosion from the upper target 12 and the radial position of the upper target 12 in relation to the wafer 16.

The profile for the lower target 14 shows a greater rate of deposition from the lower target 14 near the center of the wafer 16. This is a characteristic of the angles of erosion from the lower target 14 and the radial position of the lower target 14 in relation to the wafer 16.

The magnetron 10 is initially configured to balance the sputtering characteristics of the targets 12 and 14. The initial balancing of sputtering characteristics may be achieved by determining initial settings for the DC power applied to the targets 12 and 14. For example, the initial settings for DC power may be used to raise or lower the magnitudes of the sputtering profiles shown for the upper and lower targets 12 and 14 independently so that the combined profile is relatively flat across the surface of the wafer 16. The initial settings for the DC power may be determined by experimentation.

In one embodiment, the sputtering characteristics of the targets 12 and 14 may be balanced by adjusting the distance d2–d1 between the targets 12 and 14 by adjusting a height h2 of a spacer 20. In addition, the distances d1 and d2 may be adjusted together by adjusting a height h1 of a spacer 22. The sputtering characteristics may also be influenced in one embodiment by adjustments to the magnetic fields produced by the magnetic structures 30 and 32, 40 and 42. The magnetic structures 30 and 32, 40 and 42 may be initially adjusted to balance the rate of deposition from the targets 12 and 14 as well as achieve other objectives.

The initially balanced sputtering characteristics of the targets 12 and 14 creates a relatively uniform deposition rate across the surface of the wafer 16 thereby yielding a relatively uniform film thickness over the surface of the wafer 16 at the start of the life of the targets 12 and 14.

Figure 4:
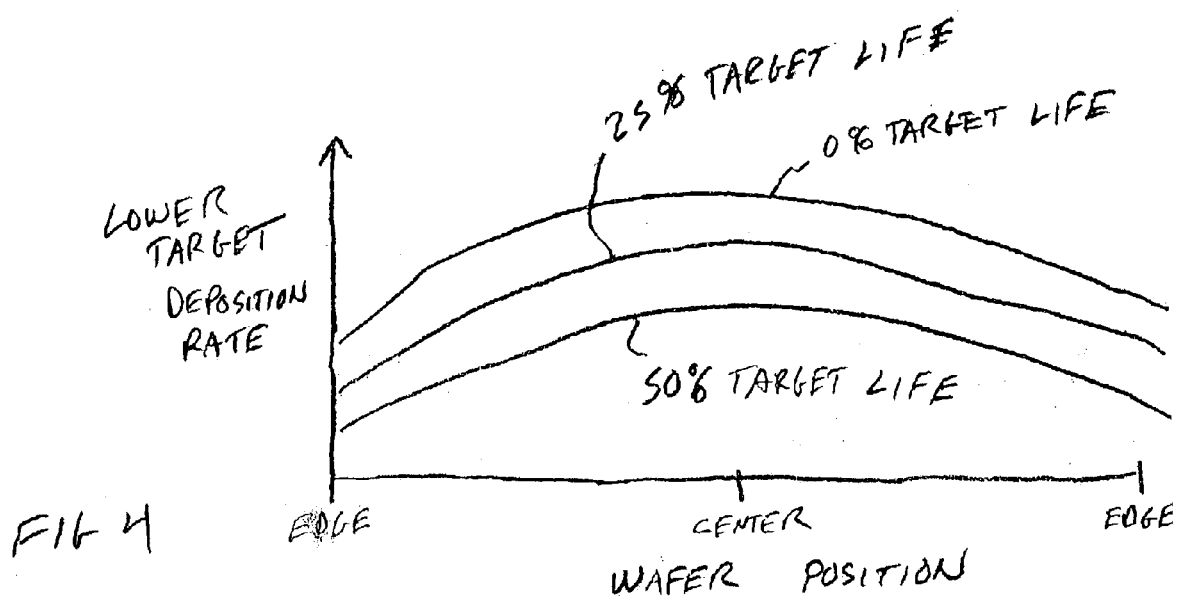
FIG. 4 show example changes to the sputtering characteristics of a target as material from the target erodes throughout its life.

FIG. 4 show example changes to the sputtering characteristics of the lower target 14 as material from the lower target 14 erodes throughout its life. Film deposition profiles are shown for a 0% target life, 25% target life, and 50% target life of the lower target 14. The film deposition from the lower target 14 maintains a similar profile but with less magnitude as more and more material is eroded from the lower target 14 as it ages.

The upper target 12 undergoes similar degradation in its sputtering characteristics through out its life. The degradation in the sputtering characteristics of the upper target 12 is less severe than the degradation in the sputtering characteristics of the lower target 14 because the upper target 12 has more mass than the lower target 14 is therefore subjected to less power density during sputtering. For example, in one embodiment the upper target 12 has a eleven inch diameter whereas the lower target 14 has a seven inch diameter.

The DC power supply 102 is used in conjunction with the AC power supply 100 to adjust uniformity of deposition of film onto the wafer 16. The power controller 104 increases the DC power applied to the targets 12 and 14 to compensate for the lower deposition rates as the targets 12 and 14 age. The DC power supply 102 is adjusted smoothly and continuously by the power controller 104 throughout the life of the targets 12 and 14 to maintain the initially balanced uniformity in film deposited onto the wafer 16.

A negative polarity is applied to the lower target 14. The power controller 104 increases the DC power to the lower target 14 because the degradation in the sputtering characteristics of the lower target 14 is more severe. The increase in DC power increases deposition from the lower target 14 substantially proportional to the DC power applied.

As the targets 12 and 14 erode, an increase in the DC power maintains the uniformity of film thickness across wafer to <0.2% in one embodiment. Resistive devices that might otherwise be employed drain the power during one half cycle, thus reducing deposition rate. As a consequence, resistive devices cannot be continuously adjusted throughout the target life with a fine increment of control. The DC power supply 102 does not reduce deposition rate. Moreover, the DC power supply 102 may be adjusted smoothly and continuously by the power controller 104 throughout the life of the target, thereby providing enhanced uniformity.

The amount of DC power needed to compensate target aging may be determined by experimentation. This information may be stored in the power controller 104 and used to adjust DC power. Alternatively, the power controller 104 may control DC power using a mathematic model that takes into account relevant information such as target life, target distances, racetrack position, etc, depending on the particular embodiment.

The power controller 104 may be implemented in code that executes on a system computer associated with the magnetron 10 or may be implemented as a power controller in hardware.

In one embodiment, the differing effects on sputtering characteristics from aging of the upper and lower targets 12 and 14 may be influenced by the fact that the magnetic structures 30 and 32 and 40 and 42 apply independent and adjustable magnetic fields to the targets 12 and 14 that may be used to control the position on the targets 12 and 14 from which the predominant amount of material is eroded. The area of the targets 12 and 14 from which the predominant amount of material is eroded is hereinafter referred to as the "racetrack." If the racetrack on the lower target 14 is moved down and to the center of the lower target 14 then a higher film thickness is deposited on the center of wafer 16. If the racetrack on the upper target 12 is moved down and to the center of the upper target 12 then a higher film thickness is deposited on the edge of wafer 16. The control of racetrack positions enables control over the stress in the film deposited on the wafer 16 and control over the uniformity of deposition while maintaining a high deposition rate and a highly piezoelectric film structure.

In an embodiment with controllable racetrack positions, the power controller 104 may take into account the positions of the racetracks when determining adjustments to DC power throughout the life of the targets 12 and 14 because the positions of the racetracks on the targets 12 and 14 may influence the deposition rate profiles for the targets 12 and 14 as the targets 12 and 14 age.

The control of racetrack position enables fine control of the stress and uniformity in the film deposited on the wafer 16. The magnetron 10 enables a user to control film stress from a highly tensile to highly compressive state. The magnetron 10 is designed in such manner that it can be easily altered to meet the different stress requirements of different products. If compressive stress is desired, the magnetic field is increased and the racetrack on the upper target 12 is moved towards the top while the racetrack on the lower target 14 is moved down. If tensile stress is desired, the magnetic field is decreased and the racetrack on the upper target 12 is moved towards the bottom while the racetrack on the lower target 14 is moved up toward the top. After the desired stress is achieved, the distance between the targets 12 and 14 may be set to optimize uniformity. Thereafter, the power controller 104 adjusts the DC power in order to maintain uniformity.

The sputtering gas pressure may be used to adjust stress. An increase in pressure leads to a higher deposition rate in the center of the wafer 16. To counteract this decrease in film thickness uniformity, the DC power supply 102 may be used to apply a bias to the targets 12 and 14 since DC bias has almost no impact on stress.

In one embodiment, the magnets in the magnetic structures 30 and 32, 40 and 42 are maintained at the potential of the targets 12 and 14 to provide the greatest interaction between magnetic and electrical fields. This produces the strongest magnetic field on the target surface in order to cause a uniform and self-adjusted erosion target profile.

It is highly preferable to employ a high-density plasma in the chamber 18 during aluminum-nitride deposition. The upper and lower targets 12 and 14 without an anode, ground or floating potential in combination with one AC power supply (20 kHz to 200 kHz) enables a very high-density and stable plasma to be generated.

The magnetron 10 may use any size and shape of conical targets. A designer may optimize film uniformity, stress, target life and energy with which the wafer 16 is bombarded by adjusting the shape of each target to match the fields produced by the corresponding magnet and pole piece combination.

Aluminum-nitride deposition at about 450 degrees C. produces piezoelectric material with the highest coupling coefficient. Uniformity of temperature across the wafer 16 provides a uniform coupling coefficient across the wafer 16. The wafer 16 may be suspended by four points near its edge thereby enabling it to heat up to 450 degrees C. uniformly. This is due to the high-density and uniform plasma produced by the AC deposition.

The magnetic fields on both of the targets 12 and 14 may have the same or opposite direction. An unbalanced magnetron and a substantially increased plasma density may be obtained by using the same direction of the magnetic field on both the targets 12 and 14.

The mechanisms in magnetron 10 render it particularly advantageous for the manufacture of FBAR filters. An FBAR filter is a series of electrically connected, air suspended membrane type resonators of piezoelectric aluminum nitride, sandwiched between two layers of metal electrodes. For application to the microwave cellular phone application, as an example, FBAR filters are constructed on a silicon wafer as individual die about 1 by 1 millimeter square. A 150 mm diameter wafer may host over ten thousand individual filters, all of which are preferably within approximately 0.2% of the nominal center frequency. A higher electro-acoustic coupling coefficient $k_t^2$ (measure of piezoelectricity of the material) in the aluminum nitride yields a lower insertion loss in cellular phone band filters. Coupling coefficients close to 7% are preferable to produce the best quality filters in these applications. The thickness of the aluminum nitride, in part, determines the frequency of the filter. Uniformity of the aluminum nitride film across wafer must be better than 0.2% one sigma for the filter yield to be 70%. If uniformity degrades to 1%, yield will be proportionately reduced to 14%, rendering commercial manufacturing of these filters problematic. Stress in the films should be user selectable in order to force the membrane to stay flat or bow up as desired. Given the desirability of manufacturing filter products at very low cost, magnetrons that manufacture this material should preferably produce aluminum-nitride films at about 1000 angstroms/minute deposition rate.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A magnetron, comprising:
   a set of concentric targets for sputtering a film onto a wafer in response to an AC power and a DC power applied to the targets wherein the targets each have a conical shape;
   power controller that adjusts the DC power to maintain a substantially uniform thickness of the film sputtered onto the wafer throughout a life of the targets.

2. The magnetron of claim 1, wherein the power controller gradually increases the DC power applied to one of the targets in comparison to the DC power applied to the other of the targets.

3. A magnetron, comprising:
   a set of concentric targets for sputtering a film onto a wafer in response to an AC power and a DC power applied to the targets;
   power controller that adjusts the DC power to maintain a substantially uniform thickness of the film sputtered onto the wafer throughout a life of the targets wherein the targets have a conical shape including an upper target and a lower target and wherein a positive polarity is applied to the upper target and a negative polarity is applied to the lower target.

4. The magnetron, comprising:
   a set of concentric targets for sputtering a film onto a wafer in response to an AC power and a DC power applied to the targets;
   power controller that adjusts the DC power to maintain a substantially uniform thickness of the film sputtered onto the wafer throughout a life of the targets wherein the targets have a conical shape including an upper target and a lower target and wherein the power controller gradually increases the DC power applied to the lower target to maintain the substantially uniform thickness.

5. The magnetron of claim 4 wherein the upper target has a greater mass than the lower target.

6. The magnetron of claim 4, wherein the power controller gradually increases a negative polarity of the DC power applied to the lower target.

7. The magnetron of claim 4, wherein the film is an aluminum-nitride film.

8. A method for sputtering a film onto a wafer in a magnetron, comprising:
   applying an AC power and a DC power to a set of concentric targets wherein the targets each have a conical shape;

adjusting the DC power to maintain a substantially uniform thickness of the film sputtered onto the wafer throughout a life of the targets.

9. A method for sputtering a film onto a wafer in a magnetron, comprising:

applying an AC power and a DC power to a set of concentric targets;

adjusting the DC power to maintain a substantially uniform thickness of the film sputtered onto the wafer throughout a life of the targets and further comprising adjusting an initial film deposition profile for each target such that a combination of the initial film deposition profiles yields the substantially uniform thickness of the film.

10. The method of claim 9, wherein adjusting an initial film deposition profile comprises adjusting a distance of each target from the wafer.

11. The method of claim 9, wherein adjusting an initial film deposition profile comprises setting an initial AC and DC power applied to the targets.

12. A method for sputtering a film onto a wafer in a magnetron, comprising:

applying an AC power and a DC power to a set of concentric targets;

adjusting the DC power to maintain a substantially uniform thickness of the film sputtered onto the wafer throughout a life of the targets and wherein adjusting the DC power comprises gradually increasing a negative polarity of the DC power applied to the target having a least mass in comparison to the other targets.

13. A method for sputtering a film onto a wafer in a magnetron, comprising:

applying an AC power and a DC power to a set of concentric targets;

adjusting the DC power to maintain a substantially uniform thickness of the film sputtered onto the wafer throughout a life of the targets and wherein the targets have a conical shape including an upper target and a lower target and wherein adjusting the DC power comprises gradually increasing a negative polarity of the DC power applied to the lower target.

* * * * *